(12) United States Patent
Barnes et al.

(10) Patent No.: US 7,756,557 B1
(45) Date of Patent: Jul. 13, 2010

(54) AC-TOLERANT HTS COATED CONDUCTOR WITH TRANSPOSED FILAMENTS

(75) Inventors: Paul N. Barnes, West Milton, OH (US); Milan Polak, Bratislava (SK); Chakrapani Varanasi, Dayton, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 832 days.

(21) Appl. No.: 11/565,037

(22) Filed: Nov. 30, 2006

Related U.S. Application Data

(60) Provisional application No. 60/740,891, filed on Nov. 30, 2005.

(51) Int. Cl.
*H01B 12/00* (2006.01)
*H01L 39/00* (2006.01)
*H01F 6/00* (2006.01)
*B32B 9/00* (2006.01)

(52) U.S. Cl. .................. 505/231; 505/230; 505/232; 505/234; 505/430; 505/431; 428/930; 427/62; 427/63; 29/599; 174/125.1; 335/216

(58) Field of Classification Search ......... 505/230–231, 505/234, 430–431, 740–741; 428/697–702; 427/62–63; 29/599; 175/125.1; 335/216
See application file for complete search history.

(56) References Cited

U.S. PATENT DOCUMENTS

2003/0032560 A1  2/2003  Otto et al.
2004/0000421 A1*  1/2004  Reis et al. ............... 174/125.1

OTHER PUBLICATIONS

Tsukamoto et al, "A Method to reduce magnetization losses in assembled conductors made of YBCO coated conductors," IEEErans on Appl. Supercond., Jun. 2005, 15(2), pp. 2823-2826.*

* cited by examiner

*Primary Examiner*—Stanley Silverman
*Assistant Examiner*—Kallambella Vijayakumar
(74) *Attorney, Agent, or Firm*—AFMCLO/JAZ; Steve Sayeedi; Daniel J. Krieger

(57) ABSTRACT

An AC-tolerant high temperature superconductor tape with transposed filaments having two layers of high temperature superconducting material with striations and corresponding filaments and an insulating layer positioned therebetween.

20 Claims, 3 Drawing Sheets

AC-TOLERANT HTS COATED CONDUCTOR WITH TRANSPOSED FILAMENTS

CROSS-REFERENCES TO RELATED APPLICATIONS

This application claims the benefit of the filing date pursuant to 35 U.S.C. §119(e) of Provisional Application Ser. No. 60/740,891, filed 30 Nov. 2005, the disclosure of which is hereby incorporated herein by reference.

RIGHTS OF THE GOVERNMENT

The invention described herein may be manufactured and used by or for the Government of the United States for all governmental purposes without the payment of any royalty.

BACKGROUND OF THE INVENTION

1. Field of the Invention

The present invention relates to the field of high temperature superconductor (HTS) coated conductors with filamentary current sharing.

2. Description of the Related Art

The YBCO is a type II high temperature superconductor capable of large current densities ($-10^6$ A/cm$^2$ at 77 K, self-field), and maintains these high current densities ($-10^5$ A/cm$^2$ at 77 K, 2 T) in applied magnetic fields. Industry is working to scale up the HTS coated conductor to long production lengths. High current YBCO HTS tape is becoming available for a variety of applications such as power transmission cables, fault current limiters, high-field magnets, transformers, motors, and generators. A number of these applications such as transformers, motors, and generators require a superconductor with minimal AC loss in order to keep refrigeration requirements, hence weight and volume, to a minimum.

Currently, industry is focusing on development of the DC conductor, in which the YBCO thin film is deposited on a metal substrate separated by buffer layers. Multiple processes (pulsed laser deposition, metal organic chemical vapor deposition, sol-gel methods, metal organic deposition, etc.) are used to deposit the YBCO film on a metal substrate textured by either the RABiTs or IBAD technique. The thin YBCO film is approximately ~0.3 µm to a few µm's thick on a metal substrate which may be approximately 4 mm to 1 cm wide, although the metal substrate can be significantly wider for manufacturing. In this superconducting thin film, current flows in a surface layer, and the thickness of this layer depends on the critical current. For a filament, this current sheath reaches the center portion of the superconductor filament when the transport current is large enough; this is the fully penetrated case.

In the fully penetrated case, the hysteresis loss in the superconductor is proportional to the width of the filament perpendicular to both the applied field and the current flow. In applications such as superconducting generators and transformers, the conductor can be exposed to alternating magnetic fields (up to a few Tesla) at high frequencies (up to a couple thousand Hz).

Since YBCO requires strict biaxial alignment, the most suitable form for creating an HTS conductor with YBCO is as an HTS coated conductor. The preferential characteristics of the YBCO coated conductor, especially its in-field performance, indicate potential for using this conductor in power generation applications such as superconducting generators, motors, and transformers.

There are many AC losses that can be introduced in the HTS conductor when placed in the aforementioned applications. These include hysteretic losses in the superconducting layer, coupling losses in a filamented superconducting layer, eddy current losses in both the substrate and stabilizing layer, ferromagnetic losses of the substrate, and transport current losses. In developing a more AC-tolerant HTS conductor, subdividing a YBCO tape into filaments can significantly decrease the hysteresis losses in AC applications. Hysteresis losses in the conductor are realized as waste heat; minimizing these losses lower the refrigeration requirement. The resulting multifilamentary structure is a tape with parallel thin strips of YBCO material separated by non-superconducting, resistive barriers. This subdivision of the HTS tape into a multifilamentary structure serves to reduce the high aspect ratio of the thin film tapes. This is necessary since the hysteresis losses of a superconducting tape are directly proportional to the width of the conductor when fully penetrated by a magnetic field. The loss per volume per cycle can be given by the following equation in SI units:

$$\frac{Q}{V} \approx \frac{1}{10} d j_c H_0$$

where d is the filament width and $H_0$ is the field amplitude which is large compared to the full penetration field $H_p$. Since filamentation of the YBCO coated conductor introduces coupling losses in AC fields, it is well known that the conductor will require twisting along its length. The twists in a flat HTS tape will be inherently volume inefficient.

An important consideration for lowering the losses in the YBCO coated conductor is that the filaments must be twisted or transposed. Bending the HTS tape itself, though possible, does have limitations due to the bend strain tolerance of the superconductor. For bending geometry, as opposed to twisting geometry, strain will be given by $$e \approx \frac{t_{YBCO}}{t_{cab}}$$

where $t_{YBCO}$ is the thickness of the YBCO in a neutral axis geometry or the distance the YBCO layer is located from center. This gives, for a 0.5% strain limitation and a t=25 µm a limitation on the bend radius to be no less than 1 cm with consideration for margin of error.

Another important consideration for lowering the hysteresis losses in the YBCO coated conductor is that the filaments must be twisted or transposed. Bending the HTS tape itself, though possible, does have limitations due to the bend strain tolerance of the superconductor. Additionally, the twists in a flat tape will be volume inefficient in application.

Therefore, a need exists for HTS tape configuration and method to create such a configuration to transpose the filaments without physically bending the superconducting material itself. This type of configuration will reduce AC losses, allow for compact design of devices that utilize AC current and reduce associated refrigeration costs.

SUMMARY

Accordingly, it is an object of this invention to provide HTS tapes with transposed or twisted filaments without physically bending the HTS material itself.

It is another object of this invention to provide a method of fabricating HTS tapes with transposed or twisted filaments without physically bending the HTS material itself.

These and other objects of the invention will become apparent as the description of the representative embodiments proceeds.

In accordance with the foregoing principles and objects of the invention, a HTS tape and a method to create the HTS tape are described.

Volume efficient YBCO coated conductors with minimal hysteresis losses are desirable for AC applications such as superconducting generators, motors, and transformers. It is well known that transposing filaments in the tape would reduce such hysteresis losses. It is also a well-known fact that twisting or bending filaments can transpose filaments, but YBCO coated conductors are subject to bending strain that makes the known twisted or bent configuration undesirable.

Advantageously, the tape configuration and method of the present invention will result in transposed filaments without the need for bending or twisting the YBCO coated conductor tape. An insulating layer and a second YBCO conductor layer is deposited on the original YBCO layer in such a manner to allow for the transposition of the filaments without physically bending or twisting the HTS tape.

BRIEF DESCRIPTION OF THE DRAWINGS

While the specification concludes with claims particularly pointing out and distinctly claiming that which is regarded as the present invention, the features, objects, and advantages of the present invention can be more readily ascertained with reference to the following description, in conjunction with the accompanying drawings, in which:

DETAILED DESCRIPTION

Figure 1:
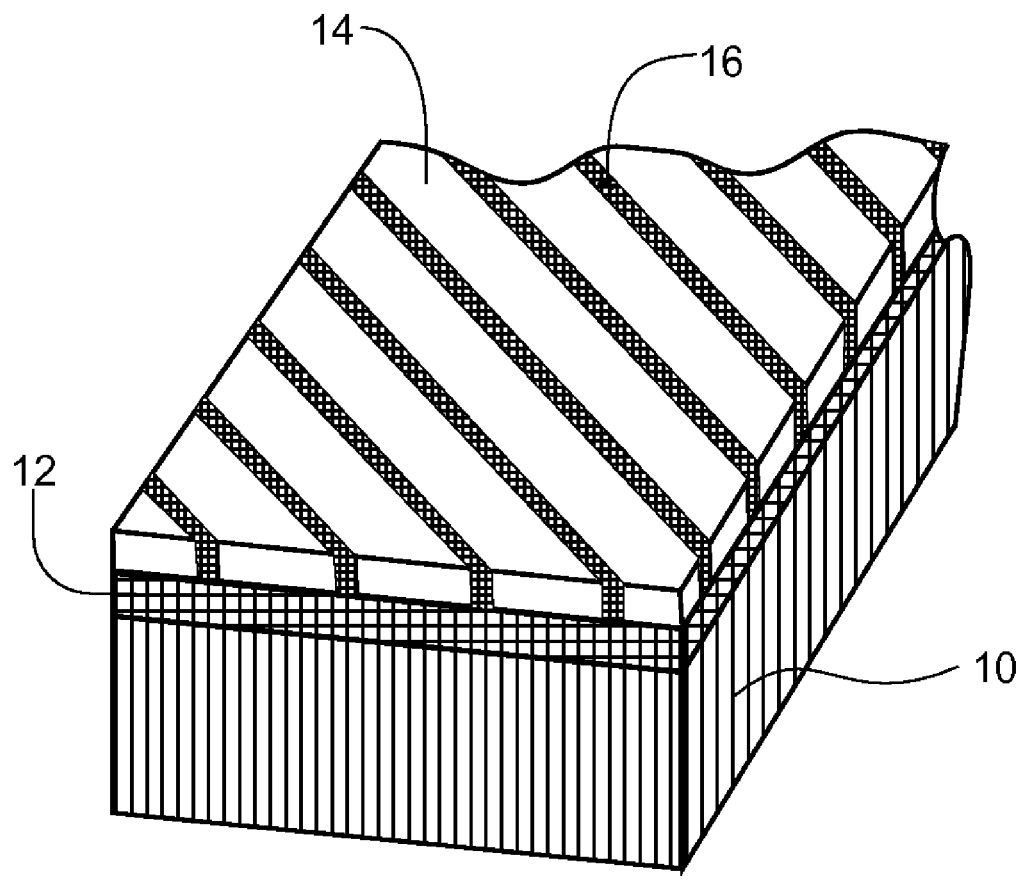
FIG. 1 is a view of the substrate, buffer layers and the first HTS layer of an embodiment of the present invention.

Referring to the drawings, FIG. 1 depicts a cross section of the multifilamentary structure of an HTS coated conductor tape according to one embodiment of the invention. A thin $YBa_2Cu_3O_{7-x}$ (YBCO) film is deposited on a metal substrate 10 separated by buffer layers 12 textured by either the RABiTs or IBAD technique. The thin YBCO film is approximately ~0.3 µm to a few µm's thick on a metal substrate which may be up to 1 cm wide, although the metal substrate can be significantly wider for manufacturing. Striations 16 in the YBCO layer create YBCO filaments 14 in the YBCO layer at an angle to the axis of the conductor. The YBCO filaments 14 must be fully segregated.

Figure 4:
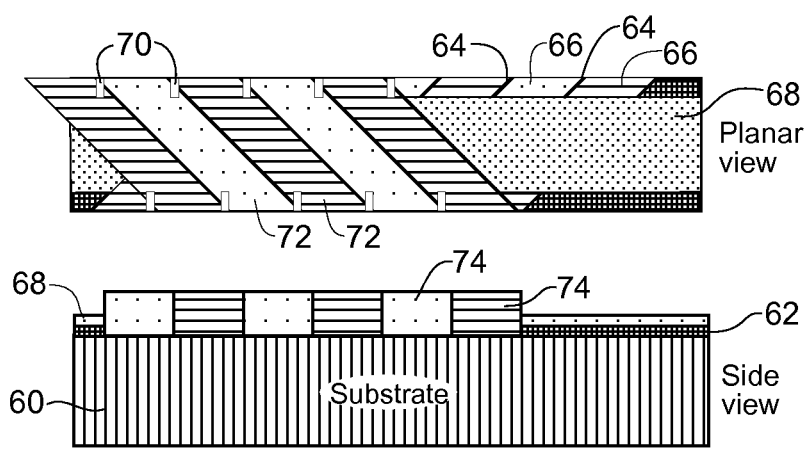
FIG. 4 is a planer and side view of an embodiment that illustrates the resulting twisted filament structure.

FIG. 4 illustrates the HTS coated conductor with transposed filaments. The term transposed includes twisted. The drawing is simplified to show only the substrate 60 on which the YBCO layer 62 is deposited. Typically, there are intervening buffer layers which are not shown in the figure. A YBCO layer 62 is deposited on top of the substrate 60. Striations 64 in the YBCO layer 62 create filaments 66 in the YBCO layer 62 at an angle to the axis of the conductor. The filaments 66 must be fully segregated.

On top of this original YBCO layer 62, an insulating layer 68 may be deposited. The insulating layer 68 insulates and electrically isolates the original YBCO layer 62 from a second YBCO layer. The insulating layer 68 is positioned such that the edges of the original YBCO layer 62 are exposed. The insulating layer 68 also provides an epitaxial template for the second YBCO layer.

Figure 5:
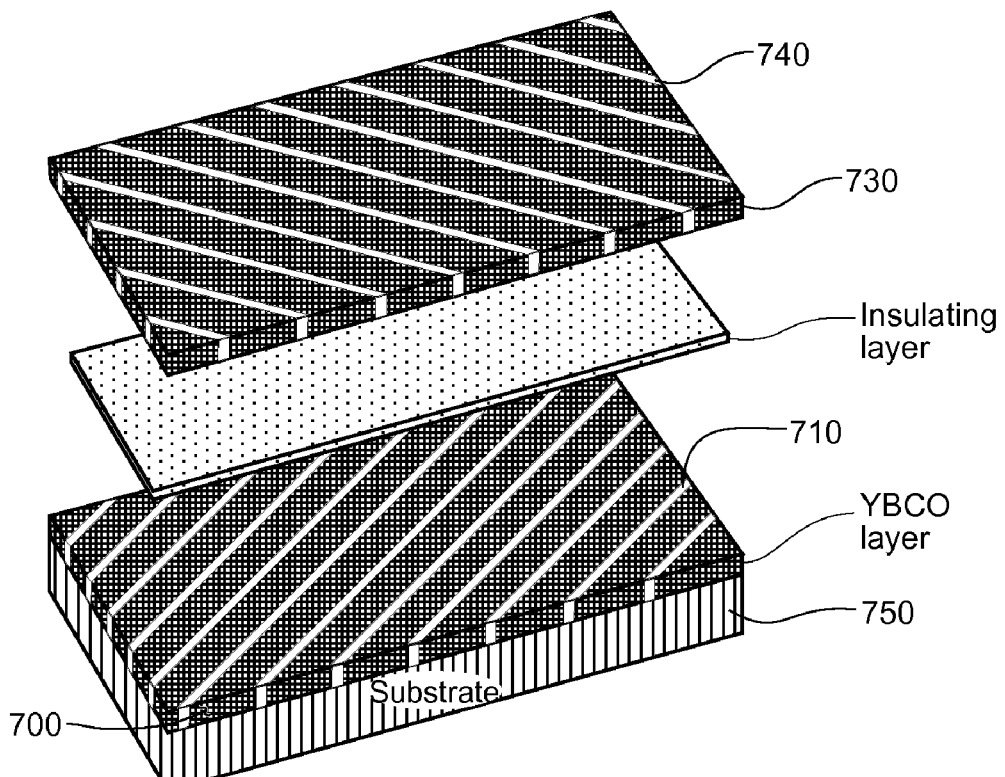
FIG. 5 is a representation of an embodiment that illustrates the relationship between the first and second HTS layers and the insulating layer.

A second layer of YBCO is deposited on top of the original YBCO layer 62 and the insulating layer 68. Striations 70 in the second YBCO layer create filaments 72 in the second YBCO layer at an angle to the axis of the conductor; the orientation of these striations 70 represent a reflection of the striations 64 contained within the original YBCO layer 62 about an axis in the plane of the original YBCO layer 62, but perpendicular to the axis of the original YBCO layer 62. The depths of the striations 70 are through the second YBCO layer only to the insulation layer 68. Separation of the filaments 66 and filaments 72 is maintained at the edges so they are electrically isolated. The deposition of the second YBCO layer on the original striated layer of YBCO 62 results in the filaments 74 being recoupled along the exposed edges of the first YBCO layer 62. An embodiment illustrated in FIG. 5 shows the positioning of the striations 740 in the second YBCO layer 730 as compared with the striations 710 in the first YBCO layer.

After the second striated YBCO layer is deposited, a continuous twisted filament exists along the length of the coated conductor. This structure forces currents to flow at the edges through the c-axis direction of the YBCO material. Critical currents in this direction are reduced by at least an order of magnitude or more. However, since the YBCO film is a micron or two thick, an order reduction in critical currents in the c-axis direction will force the planar width on either side of the intervening insulating layer to be 10-100 microns wide, which is reasonable for a 4 mm wide conductor. A reduction of two orders of magnitude is still just a fraction of a millimeter.

Figure 2:
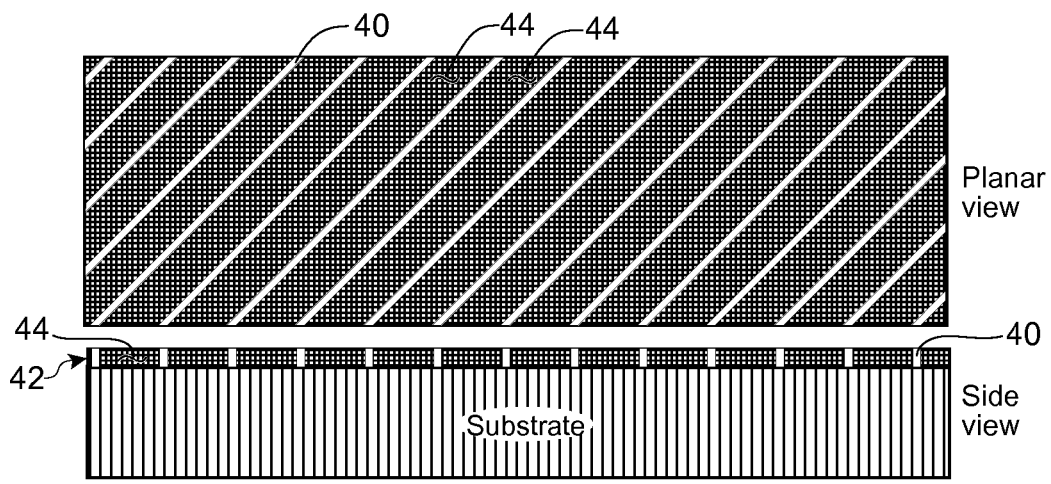
FIG. 2 is a planer and side view of the first HTS layer with striations.

Referring to FIG. 2, striations 40 in the YBCO layer 42 create filaments 44 in the YBCO layer 42 at an angle to the axis of the conductor. The filaments 44 must be fully segregated. No new material is added; the separations are made between the YBCO filaments 44 either by a removal process, such as etching or laser ablation, or some process prior to or during deposition to affect the substrate growth such as manually scribing or cutting. However, it is also possible to use a process which allows the striped pattern to be deposited without the need for subsequent scribing.

Figure 3:
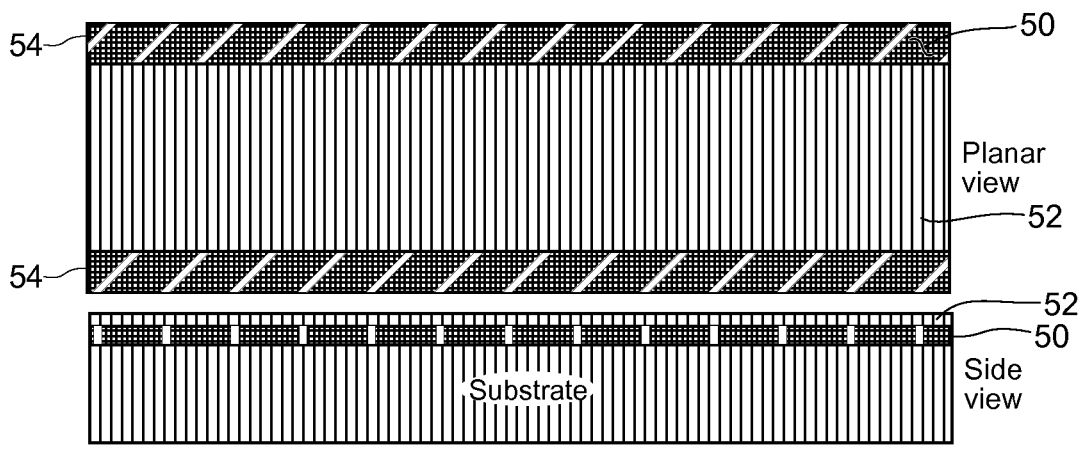
FIG. 3 is a planer and side view of the first HTS layer with striation and the insulating layer.

On top of this filamentary structure 50, an insulating layer 52 is deposited in the embodiment shown in FIG. 3. The insulating layer 52 will insulate and electrically isolate the existing YBCO layer 50 from a second YBCO layer that will be added in another step. This insulating layer 52 is added such that the edges of the original YBCO layer 50 are exposed. The insulating layer 52 also provides an epitaxial template for the subsequent YBCO layer to be deposited. Note that the edges of the filaments 54 that are exposed could have been created perpendicular to the axis of the conductor as opposed to a continuation at the same angle as the filaments underneath the insulating epitaxial layer. This configuration readily achieves the separation of filaments at the edges.

Figure 6:
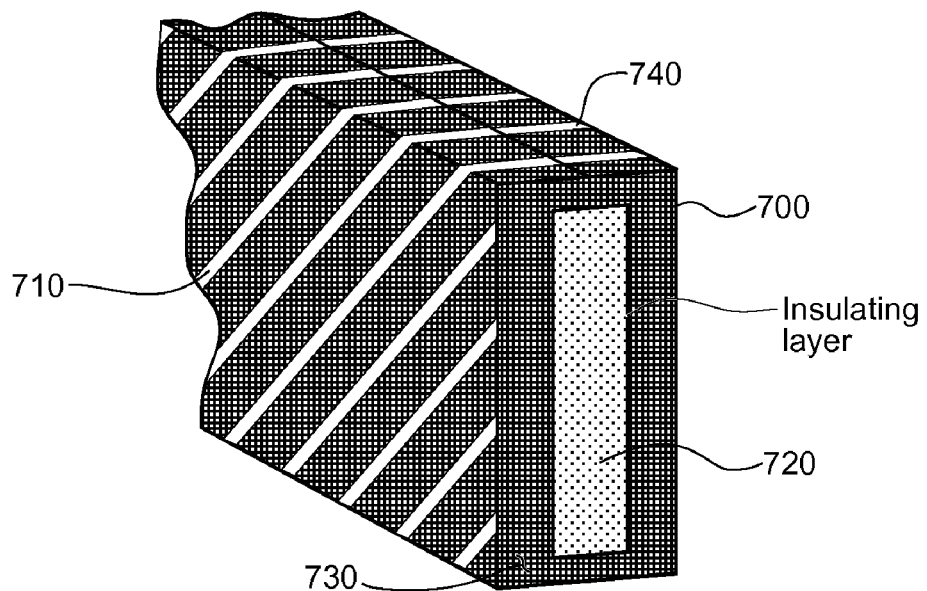
FIG. 6 is an end view of an embodiment illustrating the relationship between the first and second HTS layers and the insulating layer.

One embodiment is illustrated in FIG. 6, showing alignment of the first YBCO layer 700 having striations 740 and the second YBCO layer 730 having striations 710.

The advantages of the present invention are borne out by experimentation on small samples. Three samples were created on LAO substrates and YBCO was deposited on the substrate samples with standard conditions for pulsed laser deposition. MOI and transport data verified the integrity of the structure.

It should be noted while the method of the present invention has been described using YBCO as an example, the invention is not considered so limited. Other materials can be utilized such as Bi-based, including Bi-2212, Hg-based, or Tl-based superconductors.

In summary, numerous benefits have been described from utilizing the principles of the present invention. The present invention lowers AC losses in HTS coated conductors by transposing the filaments on the single tape resulting in lower refrigeration loads, keeping HTS generators, motors, and transformers compact and lightweight and current sharing minimizes the effect of filament quench and mechanical breakage.

Characteristics of the described and illustrated embodiments are intended for illustrative purposes and are not to be considered limiting or restrictive. It is to be understood that various adaptations and modifications may be made to the embodiments presented herein by those skilled in the art without departing from the spirit and scope of the invention, as defined by the following claims and equivalents thereof.

That which is claimed is:

1. A method of manufacturing an AC-tolerant high temperature superconductor tape with transposed filaments, comprising the steps of:
    depositing a first layer of high temperature superconducting material upon a buffered substrate, wherein the buffered substrate is a high temperature superconducting material having an upper edge and a lower edge along the length of the tape;
    creating a plurality of fully segregated striations within the first layer at an angle perpendicular to current flow, wherein the striations achieve a plurality of high temperature superconducting filaments from edge to edge;
    depositing an insulating layer upon the first layer between the upper and lower edges of the first layer;
    depositing a second layer of high temperature superconducting material having an upper and lower edge along the length of the tape upon the insulating layer and the edges of the first layer, wherein the insulating layer provides an epitaxial template for the second layer and isolates the first layer from the second layer; and
    creating a plurality of fully segregated striations within the second layer at an angle perpendicular to current flow and a mirror image of the striations within the first layer, wherein the striations in the second layer achieve a plurality of high temperature superconducting filaments in the second layer, and wherein the filaments of the first layer are aligned with the filaments of the second layer such that the filaments are recoupled at the upper and lower edges of the first and second layers of superconducting material.

2. The method of claim 1, wherein the material of the first layer and the material of the second layer is YBCO.

3. The method of claim 2, wherein the YBCO material is deposited using pulsed laser deposition.

4. The method of claim 2, wherein the YBCO material is deposited using metal organic chemical vapor deposition.

5. The method of claim 2, wherein the YBCO material is deposited using sol-gel methods.

6. The method of claim 2, wherein the YBCO material is deposited using metal organic deposition.

7. The method of claim 1, wherein the material of the first layer and the material of the second layer is Bi-based.

8. The method of claim 1, wherein the material of the first layer and the material of the second layer is Hg-based.

9. The method of claim 1, wherein the material of the first layer and the material of the second layer is Tl-based.

10. The method of claim 1, wherein the striations are created by etching.

11. The method of claim 1, wherein the striations are created by laser ablation.

12. The method of claim 1, wherein the striations are created by scribing.

13. The method of claim 1, wherein the striations are created by deposition.

14. An AC-tolerant high temperature superconductor tape with transposed filaments, comprising:
    a buffered metal substrate;
    a first layer of high temperature superconducting material, having an upper edge and a lower edge along the length of the tape, deposited on said buffered substrate, wherein said first layer includes a plurality of fully segregated striations at an angle perpendicular to current flow and a corresponding plurality of high temperature superconducting filaments;
    an insulating layer deposited upon said first layer between the upper and lower edges of said first layer, wherein said insulating layer provides an epitaxial template for said first layer; and
    a second layer of high temperature superconducting material having a plurality of fully segregated striations at an angle perpendicular to current flow and a corresponding plurality of high temperature superconducting filaments deposited upon said insulating layer and the edges of said first layer wherein said insulating layer electrically isolates said first layer from said second layer, where said plurality of fully segregated striations of said second layer are positioned in the mirror image of said plurality of striations within said first layer and wherein said plurality of filaments of said first layer are recoupled with said plurality of filaments of said second layer at the upper edge and the lower edge of said first layer.

15. The AC-tolerant high temperature superconductor tape of claim 14, wherein the material of said first layer and the material of said second layer is YBCO.

16. The AC-tolerant high temperature superconductor tape of claim 14, wherein said plurality of striations are created by etching.

17. The AC-tolerant high temperature superconductor tape of claim 14, wherein said plurality of striations are created by laser ablation.

18. The AC-tolerant high temperature superconductor tape of claim 14, wherein said plurality of striations are created by scribing.

19. The AC-tolerant high temperature superconductor tape of claim 14, wherein said plurality of striations are created by deposition.

20. An AC-tolerant high temperature superconductor tape with transposed filaments, comprising:
    a buffered metal substrate;
    a first layer of YBCO having an upper edge and a lower edge along the length of the tape, deposited on said buffered substrate, wherein said first layer includes a plurality of fully segregated striations at an angle perpendicular to current flow and a corresponding plurality of high temperature superconducting filaments;

an insulating layer deposited upon said first layer between the upper and lower edges of said first layer, wherein said insulating layer provides an epitaxial template for said first layer; and a second layer of YBCO having a plurality of fully segregated striations at an angle perpendicular to current flow and a corresponding plurality of high temperature superconducting filaments deposited upon said insulating layer and the edges of said first layer wherein said insulating layer electrically isolates said first layer from said second layer, where said plurality of fully segregated striations of said second layer are positioned in the mirror image of said plurality of striations within said first layer and wherein said plurality of filaments of said first layer are recoupled with said plurality of filaments of said second layer at the upper edge and the lower edge of said first layer.

* * * * *